(12) United States Patent
Selvaraj

(10) Patent No.: US 7,853,913 B2
(45) Date of Patent: *Dec. 14, 2010

(54) MINIMIZING NUMBER OF MASKS TO BE CHANGED WHEN CHANGING EXISTING CONNECTIVITY IN AN INTEGRATED CIRCUIT

(75) Inventor: Raja Selvaraj, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 353 days.

This patent is subject to a terminal disclaimer.

(21) Appl. No.: 12/108,199

(22) Filed: Apr. 23, 2008

(65) Prior Publication Data

US 2008/0201685 A1 Aug. 21, 2008

Related U.S. Application Data

(62) Division of application No. 10/907,674, filed on Apr. 12, 2005, now Pat. No. 7,443,020.

(30) Foreign Application Priority Data

Feb. 28, 2005 (IN) .......................... 187/CHE/2005

(51) Int. Cl.
G06F 17/50 (2006.01)
(52) U.S. Cl. .............................. 716/10; 716/12; 716/19
(58) Field of Classification Search ...................... 716/1, 716/2, 9, 19, 8, 10, 12; 257/700
See application file for complete search history.

(56) References Cited

U.S. PATENT DOCUMENTS

| | | | |
|---|---|---|---|
| 5,432,999 A * | 7/1995 | Capps et al. ................. 438/109 |
| 5,949,299 A | 9/1999 | Harada | |
| 6,232,662 B1 | 5/2001 | Saran | |
| 6,265,778 B1 | 7/2001 | Tottori | |
| 6,291,331 B1 * | 9/2001 | Wang et al. ................. 438/618 |
| 6,717,267 B1 | 4/2004 | Kunikiyo | |
| 6,768,151 B2 | 7/2004 | Kasai | |
| 7,015,582 B2 * | 3/2006 | Landis ....................... 257/758 |
| 7,151,302 B1 * | 12/2006 | Chindalore ................. 257/401 |
| 7,281,231 B2 * | 10/2007 | Kan et al. ..................... 716/12 |
| 7,371,626 B2 * | 5/2008 | Chindalore ................. 438/183 |
| 2002/0074660 A1 * | 6/2002 | Fukasawa ................... 257/758 |
| 2002/0135277 A1 | 9/2002 | Sube et al. | |
| 2002/0173111 A1 | 11/2002 | Kasai | |
| 2003/0094642 A1 | 5/2003 | Houston et al. | |
| 2004/0031004 A1 | 2/2004 | Yoshioka | |
| 2004/0119164 A1 | 6/2004 | Kurashima et al. | |
| 2004/0264837 A1 | 12/2004 | Ogawa | |
| 2005/0110130 A1 | 5/2005 | Kitabayashi et al. | |
| 2005/0110146 A1 | 5/2005 | Wang | |

(Continued)

Primary Examiner—Sun J Lin
(74) Attorney, Agent, or Firm—Mirna Abyad; Wade J. Brady, III; Frederick J. Telecky, Jr.

(57) ABSTRACT

A method and apparatus for fabricating integrated circuits providing a desired operation using a plurality of masks, wherein each of said plurality of masks is used to control a corresponding one of a plurality of layers to form said integrated circuits. Said method includes incorporating a plurality of dummy stacks along with a functional block, said functional block providing said desired operation, each of said dummy stack providing a point of common connectivity on a plurality of metal layers comprised in said plurality of layers.

8 Claims, 5 Drawing Sheets

U.S. PATENT DOCUMENTS

| | | |
|---|---|---|
| 2005/0161835 A1 | 7/2005 | Maeda |
| 2006/0022195 A1 | 2/2006 | Wang |
| 2006/0055028 A1 | 3/2006 | Hasunuma |
| 2006/0081883 A1 | 4/2006 | Zhang |
| 2006/0154469 A1 | 7/2006 | Hess et al. |
| 2006/0154479 A1 | 7/2006 | Lee |

* cited by examiner

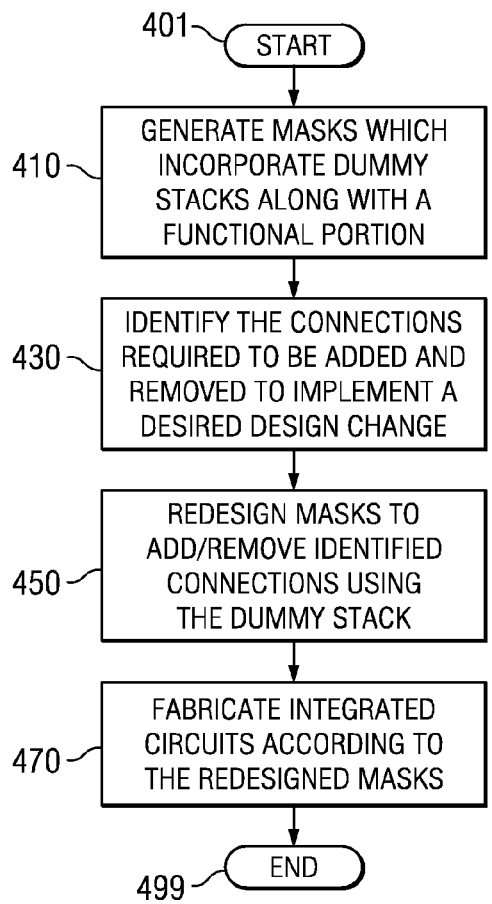
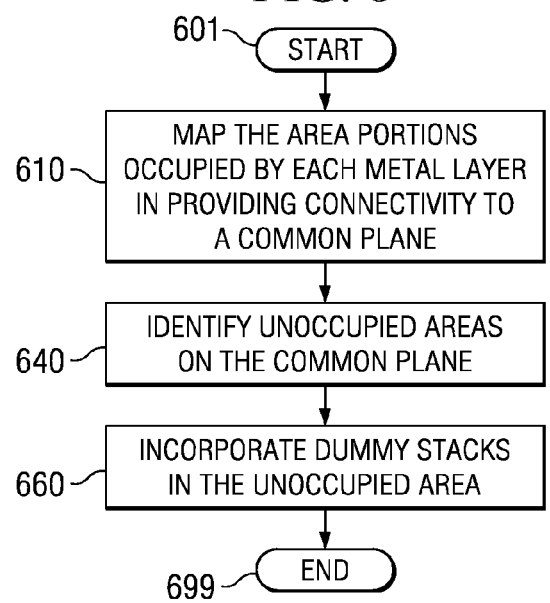

MINIMIZING NUMBER OF MASKS TO BE CHANGED WHEN CHANGING EXISTING CONNECTIVITY IN AN INTEGRATED CIRCUIT

CROSS-REFERENCE TO RELATED APPLICATIONS

This application is a divisional application relating to U.S. Pat. No. 7,443,020 filed on Apr. 12, 2005, which is herein incorporated by reference.

DESCRIPTION

1. Field of the Invention

The present invention relates to the design of integrated circuits, and more specifically to a technique which minimizes the number of masks to be changed when changing existing connectivity in an integrated circuit.

2. Related Art

An integrated circuit contains circuit elements such as transistors, resistors, capacitors etc., connected according to a circuit design. In general, the circuit elements are fabricated in a base layer, and a metal layer above the base layer provides interface to the terminals of the circuit elements. Thus, with reference to FIG. 1, circuit elements are fabricated in base layer 110, and metal layer 120 provides via for interface to the terminals of the circuit elements.

Connectivity between the circuit elements is attained by providing a metal path between the corresponding terminals. The metal path in turn is attained by a number of metal layers (130, 140, 160, 170 and 180) and vias (135, 145, 165, 175), as is well known in the relevant arts. While the metal layers provide a conductive path, vias provide connectivity from one metal layer to another metal layer at a desired location (according to the desired circuit design). Accordingly, it may be appreciated that an integrated circuit generally contains several different layers.

Masks are used to fabricate many integrated circuits of the same circuit design, as is also well known in the relevant arts. In general, a mask is used to control the manner in which specific areas of each layer are treated (e.g., where a metal is laid or where the metal is etched) in the fabrication steps. The masks are designed to lay the layers, which together implements the circuit elements and the desired connectivity. The masks thus designed are used for fabricating the integrated circuits.

There is often a need to change connectivity between elements of a circuit design. The need for such a change can be due to reasons such as improved performance, faults in previous circuit etc. For illustration, it is assumed that FIG. 2A represents an existing (portion of a) circuit connectivity according to a design specification and FIG. 2B represents the desired changed circuit.

Both circuits are shown containing resistors 230, 240 and 260 and terminals of the resistors are respectively identified as A and B, C and D, and E and F. In FIG. 2A, the circuit connectivity indicates that the terminals A, C and E are connected together and terminals B, D, and F are connected together. On the other hand, in FIG. 2B, terminals A and F are connected together, terminals B, C and E are connected together, and terminal D will be connected to the rest of the circuit (not shown in the Figures).

Changes to connectivity requires redesign of at least some masks, as illustrated with reference to FIGS. 3A and 3B. FIG. 3A represents an example layout corresponding to the integrated circuit of FIG. 2A. Integrated circuit is shown containing base layer 310, via interface layer 320, metal layers 330, 340, 360, 370 and 380 and via layers 335, 345, 365, and 375.

Base layer 310 implements resistors 130, 140, 160 and is shown by respective terminals. Via interface layer 320 extends the terminals A-F to external metal layer for connectivity. Metal layer 330 makes contact with interface layer 320. No circuit connectivity is provided on metal layer 330 due to various design constraints (e.g., signal interference conditions) posed by other portions (not shown) of the IC. As a result, terminals A-F are further extended to metal layer 340 by vias on layer 335.

Metal layer 340 provides connectivity between terminals A and C (portion 341), and D and F (portion 342). Due to design constraints or barrier, it is assumed that the remaining connections cannot be provided on this layer. As a result, terminals C, B, E, and D are further extended to metal layer 360 using vias in layer 345.

Metal layer 360 provides connectivity (portion 361) between terminals C and E only, and remaining connection between terminals B and D is provided on metal layer 380 (portion 382). Hence, terminals B and D are extended to metal layer 380 using vias on layer 365 and 375 and a metal layer 370.

Thus, masks (9 in addition to those for base layer 310) are generated for each of metal and via layers, and the masks are then used to fabricate ICs as noted above. To illustrate the number of masks that may be needed to be changed corresponding to the circuit design change from FIG. 2A to 2B, the layout corresponding to FIG. 2B is described below with respect to FIG. 3B.

FIG. 3B represents the layout corresponding to the integrated circuit of FIG. 2B. Since changes are reflected only in connectivity of the circuit, implementation of base layer 310, via interface layer 320, metal layer 330 and via layer 335 remain unchanged. For conciseness and clarity, the changes in each layer are described in relation to FIG. 3A.

A change is incorporated in metal layer 340 by removing metal portions (represented by 341 and 342 in FIG. 3A) making connection between A and C, and D and F respectively. These changes are necessitated based on the differences of FIG. 2A and FIG. 2B.

Continuing with respect to FIG. 3B, on metal layer 360, connectivity between terminals C, B, and E is implemented (portion 366) (as shown necessary in FIG. 2B). On metal layer 380, connectivity between terminal B and D is removed (portion 382) and connectivity between terminals A and F is provided. As a result, terminal A and terminal F, which were available only up to metal layer 340 in FIG. 3A, are now shown extended up to metal layer 380 using vias/metals on layers 345, 360, 365, 370, 375 and 380. In addition, a new metal path (portion 386) connecting terminal A and F is laid.

As a result, a total of seven masks representing metal layers 340, 360, 370 and 380, and masks representing vias on layers 345, 365, and 375 are re-generated (redesigned) to incorporate changes in circuit connectivity from FIG. 2A to FIG. 2B.

In general, it is desirable to minimize the number of masks (at least to reduce the overall costs associated with the change) which would need to be changed, when making such circuit connectivity changes.

BRIEF DESCRIPTION OF THE DRAWINGS

The present invention will be described with reference to the following accompanying drawings.

FIG. 4 is a flowchart illustrating the approach using which the number of masks to be changed can be minimized, when changing existing connectivity in an integrated circuit, according to an aspect of the present invention.

FIG. 6 is a flowchart illustrating the manner in which the location for laying dummy stacks can be determined according to an aspect of the present invention.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
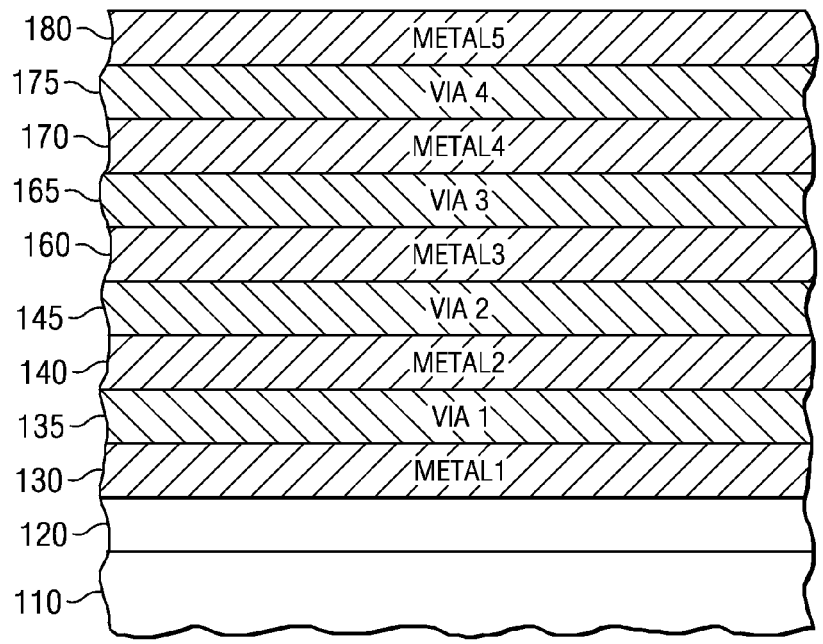
FIG. 1 is a diagram illustrating the various layers used in the fabrication of an integrated circuit (IC) in a prior embodiment.

An aspect of present invention reduces the number of masks which would need to be changed/redesigned, when changing existing connectivity in (the design of) an integrated circuit. Such a feature is attained by incorporating dummy stacks into the circuit layout, with each dummy stack having the ability to provide connectivity on all layers of the metal. As the dummy stacks provide the flexibility of connectivity at any desired layer (which may otherwise be redesigned to achieve the desired connectivity change), redesign of at least some of the other masks is avoided while changing circuit connectivity.

Another aspect of the present invention provides an approach using which suitable locations are determined for laying the dummy stacks. The areas covered by each metal layer is mapped to a common plane (e.g., area covered by one of the layers), and the area on the common plane not covered by anyone of the metal layers is deemed to be suitable for the dummy stacks.

Various aspect of present invention overcome at least some of the limitation described above. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Approach

FIG. 4 is a flow chart illustrating the details of an approach which minimizes the number of masks to be changed when changing existing connectivity in an integrated circuit. The Figure is described with respect to FIGS. 2A and 2B for illustration. However, the approach(es) can be used in conjunction with other circuits (and change scenarios) as well. The flowchart begins with step 401 and control immediately passes to step 410.

In step 410, a designer generates masks incorporating dummy stacks along with a functional portion in an integrated circuit (IC). Each dummy stack provides a point of common (electrical) connectivity on at least some of the metal layers, but is not connected to the functional portion. The functional portion provides the desired circuit operation, while the dummy stacks facilitate (any later required) changing of the connectivity in the IC (according to various aspects of the present invention), as described below in further detail.

In step 430, the designer identifies the connections required to be added and removed to implement a desired design change. The additions/removals can be identified by comparing the (pre) existing circuit connectivity with the desired circuit connectivity, as illustrated above with reference to FIGS. 2A and 2B.

In step 450, the designer redesigns masks using the dummy stacks to add and/or remove the identified connections. As the dummy stacks provide a point of common connectivity to multiple layers, the dummy stacks can conveniently be used to provide connectivity in any of the multiple layers.

As a result, mask corresponding to a layer, which requires redesign otherwise, can be used to add the identified connections in the same layer using the dummy stacks. Thus, the need to redesign some of the masks may be avoided, thereby reducing the total number of masks which need to be changed to effect desired changes in circuit connectivity.

In step 470, integrated circuits are fabricated using the redesigned set of masks. Control then transfers to step 499, in which the method ends. It should be understood that some/all of the above steps can be implemented either manually or using various design tools. As noted above with respect to step 450, the number of masks to be redesigned, is reduced due to the use of the dummy stacks. The approach of FIG. 4 is illustrated in further detail below, with reference to FIGS. 5A and 5B.

3. Example Illustrating the Use of Dummy Stacks

Figure 5A:
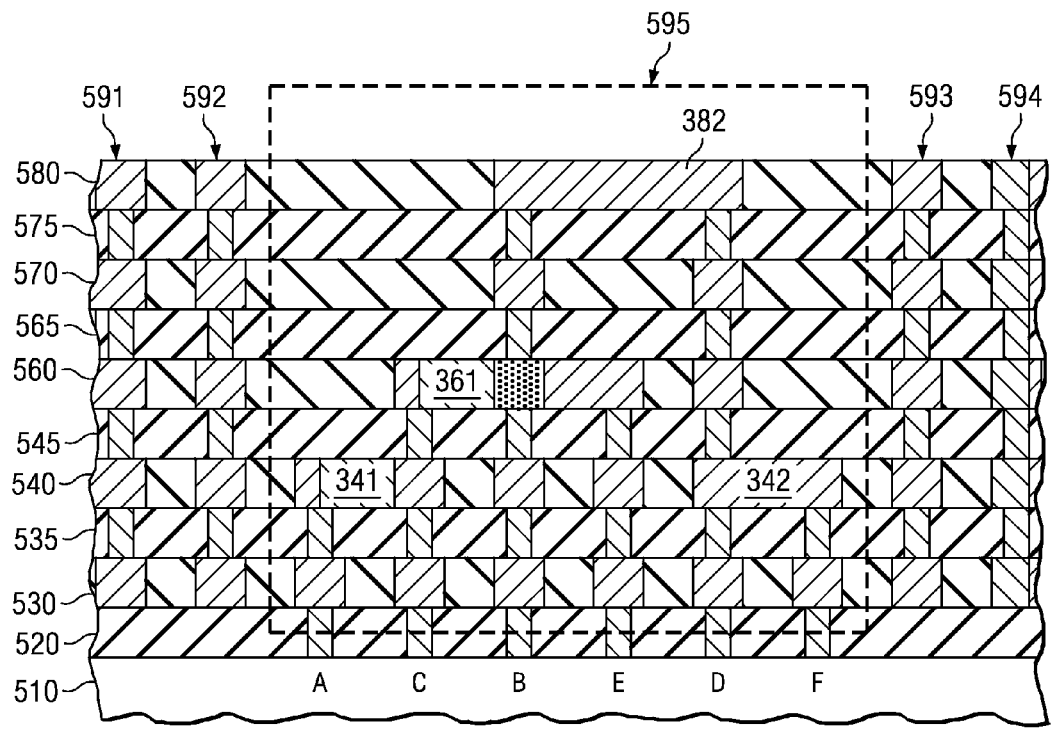
FIG. 5A illustrates the manner in which dummy stacks can be laid along with a functional block in an integrated circuit according to an aspect of the present invention.
Figure 5B:
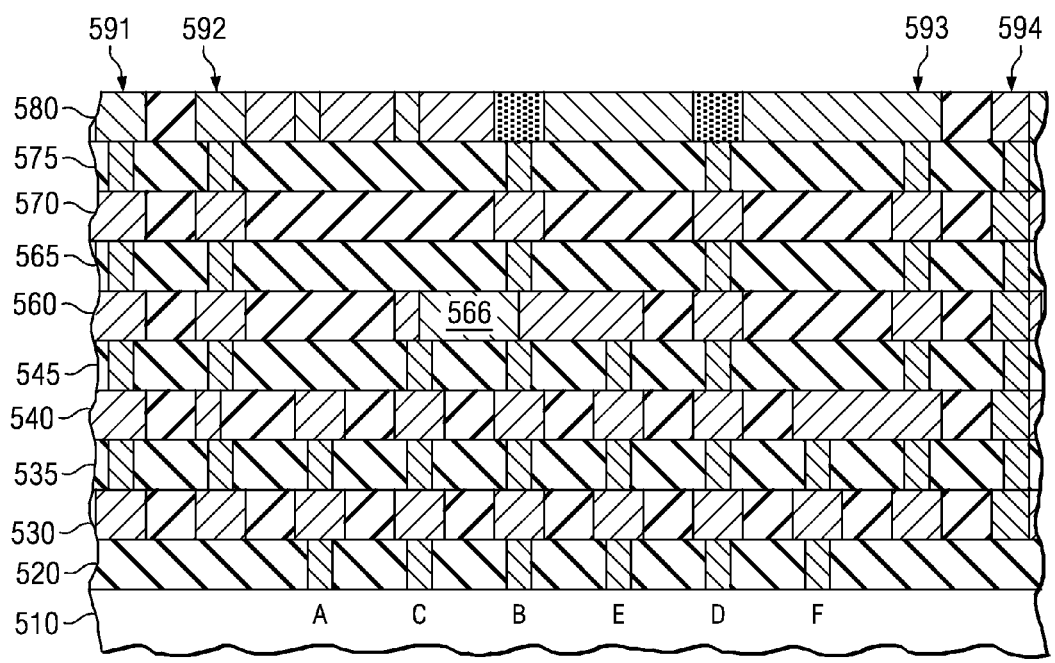
FIG. 5B illustrates the manner in which dummy stacks can be used in changing connectivity of elements of a functional block, according to an aspect of the present invention.

FIGS. 5A and 5B together illustrate an example layouts in accordance with the approach(es) described in FIG. 4. In particular, the layouts of FIGS. 5A and 5B respectively correspond to the circuits of FIGS. 2A and 2B, as described below.

With respect to FIG. 5A, the integrated circuit there is shown containing functional block 595, dummy stacks 591-594, base layer 510, via interface layer 520, metal layers 530, 540, 560, 570 and 580, and via layers 535, 545, 565, and 575. Each portion is described below in further detail.

Figure 2A:
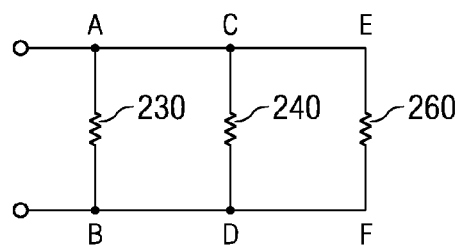
FIG. 2A represents an example portion of a circuit design.

Functional block 595 represents the layout portion for the circuit of FIG. 2A. The implementation of functional block 595 is similar to the implementation in FIG. 3A, and is not repeated in detail for conciseness. Connectivity between terminals A and C (portion 341), and D and F (portion 342) are provided on metal layer 540, connectivity (portion 361) between terminals C and E is provided on metal layer 560 and connection (portion 382) between terminals B and D is provided on metal layer 580 as described with reference to FIG. 5A.

Dummy stacks 591,592,593, and 594 are generated along with functional block 595. Each dummy stack is shown making contact with all the metal layers using vias on layers 535, 545, 565, 575. Thus, each dummy stack is shown containing vias to provide a point of common connectivity (in all layers).

However, dummy stacks do not make contact with any of the metal portions representing functional block, as can be readily observed.

Thus, masks are generated for each of metal and via layers defining functional blocks and dummy stacks, and the masks are then used to fabricate ICs as noted above. Description is continued to illustrate the reduction in number of masks that may be needed to be changed to incorporate the circuit design change from FIG. 2A to 2B, according to the approach(es) of FIG. 4.

Figure 2B:
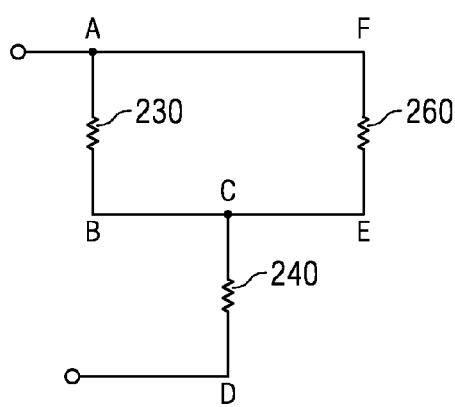
FIG. 2B illustrates the desired changes to connectivity of elements of the circuit design.

FIG. 5B is an example layout implementation providing connectivity corresponding to the changed circuit design in FIG. 2B using dummy stacks provided in FIG. 5A. For conciseness and clarity, the changes in each layer are described in relation to FIG. 5A. Implementation of base layer 510, via interface layer 520, metal layer 530 and via layer 535 remain unchanged as changes are required only in connectivity.

A necessary change representing removal of metal portions (represented by 341 and 342 in FIG. 5A) is incorporated on metal layer 540 to remove the connection between A and C, and D and F respectively and on metal layer 580, connectivity between terminal B and D is removed (portion 382). These changes in layers 540 and 580 are necessitated based on the differences of FIG. 2A and FIG. 2B.

Figure 3A:
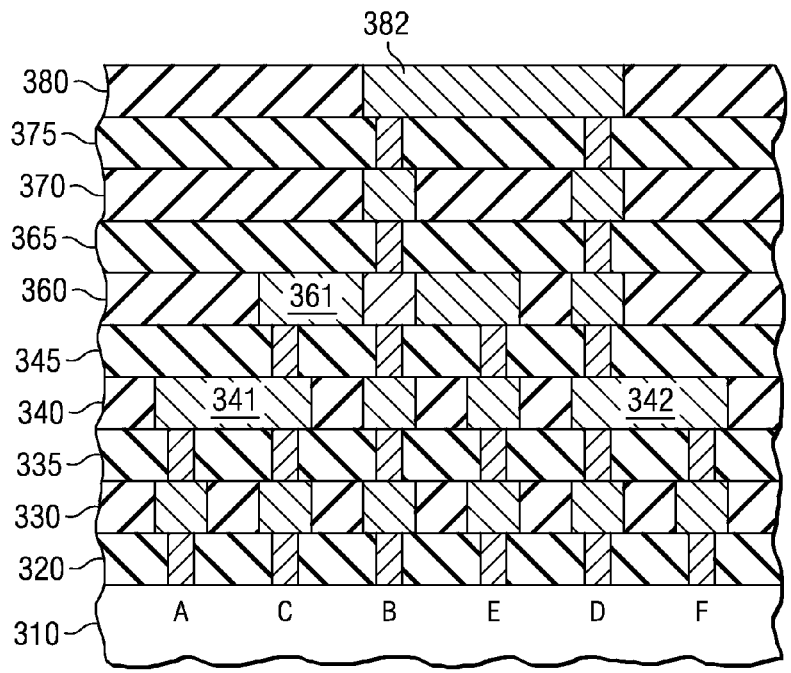
FIGS. 3A and 3B respectively illustrate the layouts corresponding to FIGS. 2A and 2B in one prior embodiment.
Figure 3B:
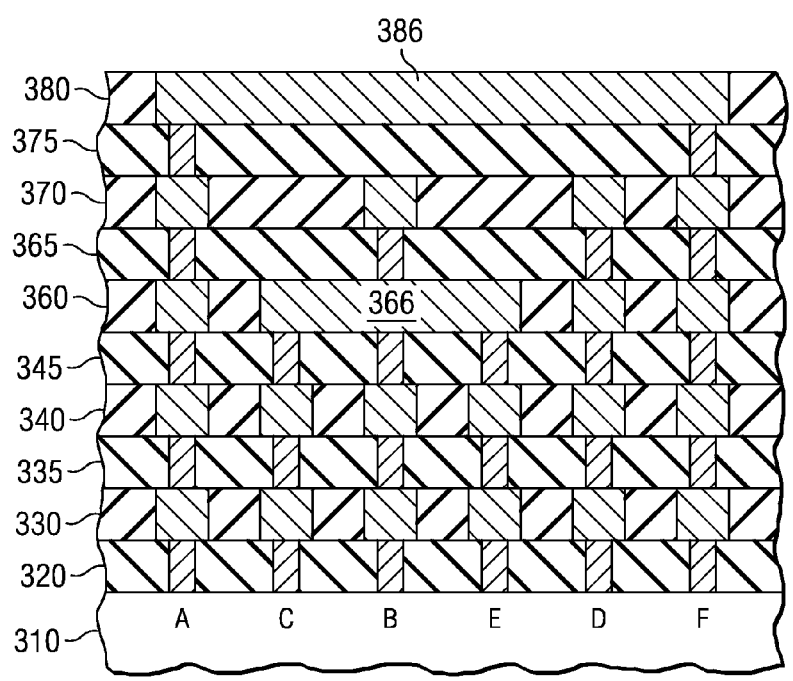

Continuing with respect to FIG. 5B, on metal layer 560, connectivity for terminals C, B and E are implemented according to explanation provided in FIG. 3B. Connectivity between terminals C, B, and E is implemented (portion 566) (as shown necessary in FIG. 2B). Connectivity between terminal A and F on layer 580 is provided using dummy stacks 592 and 593.

Terminals A and F are connected to dummy stacks 592 and 593 on layer 540. As a result the dummy stacks 592 and 593 extends the terminal A and F respectively on to all the layers and up to layer 580. A metal path is implemented connecting metal portion of the dummy stack on layer 580 according to a design requirement. As a result, connectivity between terminals A and F is established on layer 580.

From the above, it should be appreciated that layers 540 and 580, which were required to be changed otherwise, were used to provide connectivity using the dummy stacks provided according to various aspects of the present invention. As a result, only three masks (540, 580 and 560) need to be changed according to the approaches of FIG. 4, compared to changes to seven masks in the prior approach.

It should be further appreciated that the numbers (3 versus 7) is based on some assumptions that other portions (not shown) pose constraints on the layout designs (which is typical in IC designs). The layouts of FIGS. 3A, 3B, 5A and 5B are based on the below common constraints:

1) Connectivity for A and C and D and F are allowed on metal layer 2;
2) Connectivity for C and E are allowed on metal layer 3;
3) Connectivity for terminal B and D are allowed on metal layer 5;
4) Connectivity for C and E are allowed on metal layer 3;
5) Connectivity for A and F are allowed on metal layer 5; and
6) Connectivity for B and C and B and E are allowed on metal layer 3.

Thus, due to the use of dummy stacks, changes are made only on metal layers 340, 360, 380 and remaining layers are unchanged. Hence masks corresponding to layers 540, 560, 580 are regenerated and masks corresponding to other layers are retained from the previous design (corresponding to FIG. 5A) to fabricate an integrated circuit according to the changed circuit design.

It should be generally understood that the specific (relative) location at which each dummy stack can be laid needs to be determined. An example approach for determining the location of dummy stacks along with the functional block is described below with a flow chart.

4. Locating Dummy Stacks

FIG. 6 is a flow chart illustrating an example approach for determining the location of dummy stacks along with the functional block. The flow chart can be implemented using various design tools, and the flow chart is accordingly described with reference to a design tool. The flow chart begins with step 601 and control immediately passes to step 610.

In step 610, the tool maps the area portions occupied by each metal layer in providing connectivity for elements forming the functional portion to a common plane. In general, some additional area around the area portions is also considered to be occupied, for various reasons such as signal integrity, etc.

In step 640, the tool identifies unoccupied metal areas on the common plane. Thus, the unoccupied area represents the free space in which stack elements spanning all the metal layers can be laid.

In step 660, dummy stacks are laid in the unoccupied metal area. Dummy stacks can be implemented in the form of two dimensional array spaced conveniently apart to allow routing to the stacks and other design requirements. The flowchart then ends in step 699.

It should be appreciated that a dummy stack can be laid in fewer than all the metal layers, and only those metal layers would be available for changing connectivity requirements. However, a designer may conveniently have dummy stacks covering different metal layers, and combination of dummy stacks can be used to provide the desired connectivity changes. The flowchart is further described with respect to functional block of FIG. 3A for clearer understanding.

5. Example Illustrating Identification of Locations for Dummy Stacks

Figure 7A:
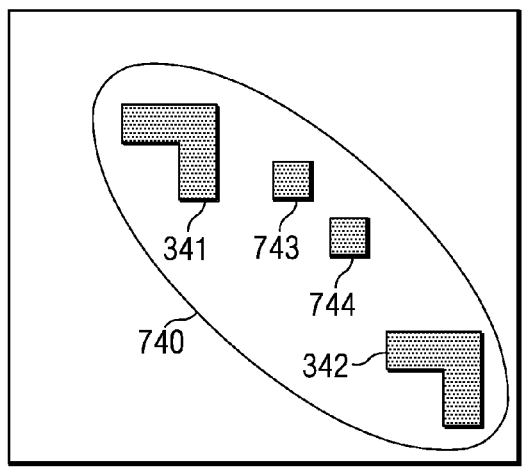
FIGS. 7A-7C illustrate the area portion occupied by corresponding metal layer in providing connectivity for elements forming the functional portion.
Figure 7B:
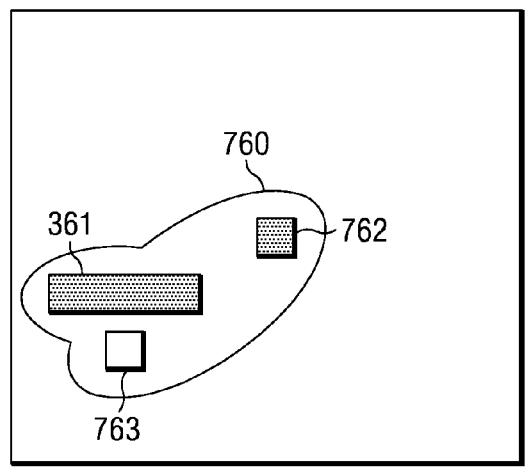
Figure 7C:
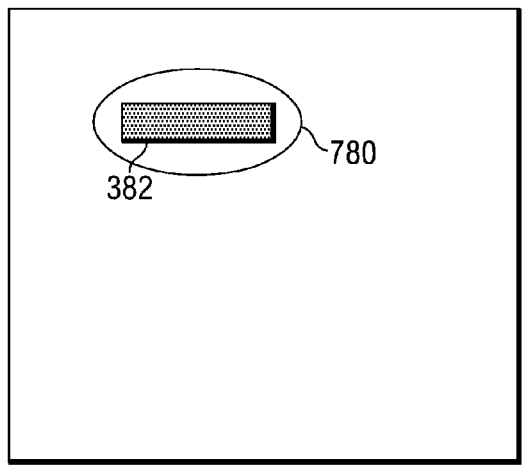
Figure 7D:
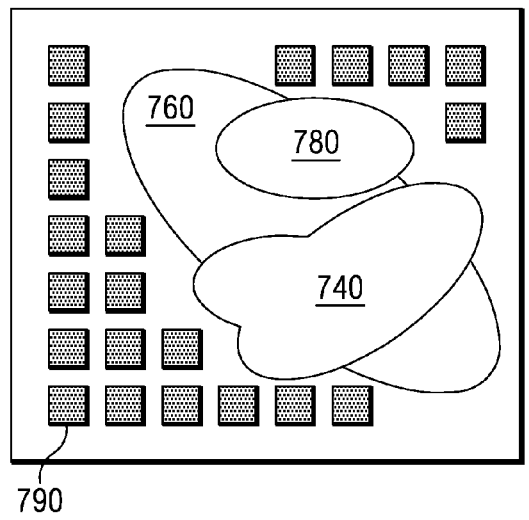
FIG. 7D illustrates the overlap of the area portions of FIGS. 7A-7C, to determine the common free area available to lay dummy stacks.

FIGS. 7A through 7D illustrate the approach described in FIG. 6 with respect to functional block of FIG. 3A. FIGS. 7A, 7B, and 7C respectively represent a top view of layers 340, 360, and 380, illustrating the area portions occupied by respective metal layers, and FIG. 7D represents a common plane with superimposition of all the area portions.

Continuing with reference to FIG. 7A, 341 and 342 represent metal portions used for providing connectivity between terminals A and C, and D and F respectively. Similarly, 743 and 744 represent metal portions used to provide connectivity to upper layers using vias. Area 740 represents total area portion on layer 340 used for implementing connectivity of elements in the functional block.

Similarly, with reference to FIG. 7B, 361 represents metal portion used for providing connectivity between terminals C and E. 762 and 763 represent metal portion used to provide connectivity to upper layer using vias. Area 760 represents total area portion used on metal layer 360 for implementing connectivity of elements in the functional block.

Further with reference to FIG. 7C, 382 represents metal portion used for providing connectivity between terminals B and D. Area 780 represents the total area portion used for implementing functional bock on layer 380.

FIG. 7D represents a common plane on which areas 740, 760, 780 are superimposed to determine the free common area available on all metal layer. The free common area is represented by 790, and any number of desired dummy stacks can be laid to the extent permissible in area 790 by the applicable design rules.

It should be understood that for conciseness only three layers (corresponding to FIGS. 7A-7C) have been considered in determining the common free area of FIG. 7D. However, all the layers may be similarly considered when determining the locations of dummy stacks that span all the metal layers. Thus, using the above approaches, dummy stacks can be used to minimize the number of masks to be changed when changing existing connectivity in an integrated circuit.

In addition, the flowchart of FIG. 6 can be implemented to be operative in a digital processing system (supporting computer aided design of integrated circuits) by execution of appropriate software instructions embodied on a machine readable medium ("computer program product"). The machine readable medium is generally provided in either removable form (e.g., CD, tape) or integrated (e.g., a hard drive) into the system. When the software instructions are executed, the user interface enables a user to determine the appropriate place on a die to locate the dummy stacks when designing integrated circuits upfront.

6. CONCLUSION

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of a processor for fabricating integrated circuits providing a desired operation using a plurality of masks, wherein each of said plurality of masks is used to control a corresponding one of a plurality of layers to form said integrated circuits, said method comprising:
   incorporating via said processor a plurality of dummy stacks along with a functional block, said functional block providing said desired operation, each of said dummy stacks providing a point of common connectivity on a plurality of metal layers comprised in said plurality of layers.

2. The method of claim 1, wherein said plurality of metal layers comprise all metal layers providing connectivity to elements contained in said functional block.

3. The method of claim 1, wherein each of said dummy stacks contains vias to provide said point of common connectivity.

4. The method of claim 1, further comprising fabricating said integrated circuits using masks designed according to said incorporating.

5. The method of claim 1, further comprising:
   Identifying connections required to be added and removed to implement a desired design change; and
   redesigning some of said plurality of masks to add/remove identified connections using a dummy stack, wherein said dummy stack is connected to said functional block.

6. The method of claim 5, further comprising fabricating said integrated circuits using masks designed according to said redesigning.

7. The method of claim 1, further comprising:
   mapping to a common plane area portions occupied by each of said plurality of metal layers in providing connectivity for elements forming said functional block ; and
   identifying unoccupied areas on said common plane,
   wherein said incorporating incorporates said plurality of dummy stacks in said unoccupied areas.

8. A non-transitory computer readable medium carrying one or more sequences of instructions for causing a system to implement a computer-aided design of an integrated circuit, wherein said integrated circuit comprises a plurality of metal layers used to implement a functional portion of said integrated circuit, wherein execution of said one or more sequences of instructions by one or more processors contained in said system to cause said one or more processors to perform the actions of:
   mapping to a common plane area portions occupied by each of said plurality of metal layers in providing connectivity for elements forming said functional portion of said integrated circuit; and
   identifying unoccupied areas on said common plane,
   wherein a plurality of dummy stacks are incorporated in said unoccupied areas.

* * * * *